United States Patent
Huang

(10) Patent No.: US 7,656,043 B2
(45) Date of Patent: Feb. 2, 2010

(54) SEMICONDUCTOR PACKAGE AND METHOD FOR MANUFACTURING THE SAME

(75) Inventor: Yao Ting Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 182 days.

(21) Appl. No.: 12/019,453

(22) Filed: Jan. 24, 2008

(65) Prior Publication Data

US 2008/0136014 A1 Jun. 12, 2008

Related U.S. Application Data

(62) Division of application No. 11/049,867, filed on Feb. 4, 2005, now Pat. No. 7,335,987.

(30) Foreign Application Priority Data

Feb. 6, 2004 (TW) .............................. 93102846 A

(51) Int. Cl.
- H01L 23/48 (2006.01)
- H01L 23/52 (2006.01)
- H01L 29/40 (2006.01)

(52) U.S. Cl. ...................................... 257/778; 257/701
(58) Field of Classification Search ................. 257/778, 257/731, 701, 730, 723, 734, 737, 738, 780
See application file for complete search history.

(56) References Cited

U.S. PATENT DOCUMENTS

| 5,903,052 | A | 5/1999 | Chen et al. |
| 6,580,618 | B2 | 6/2003 | Pu |
| 6,936,930 | B2 * | 8/2005 | Wang .......................... 257/778 |
| 7,126,209 | B2 * | 10/2006 | Minamio et al. ............. 257/666 |
| 7,271,476 | B2 * | 9/2007 | Nishikawa et al. .......... 257/684 |
| 7,294,928 | B2 * | 11/2007 | Bang et al. ................... 257/737 |
| 7,344,969 | B2 * | 3/2008 | Tan et al. ..................... 438/612 |
| 7,569,922 | B2 * | 8/2009 | Ogata .......................... 257/686 |
| 2002/0189091 | A1 | 12/2002 | Ding et al. |
| 2006/0145339 | A1 * | 7/2006 | Yang et al. ................... 257/724 |

* cited by examiner

Primary Examiner—S. V Clark

(57) ABSTRACT

A semiconductor package includes a semiconductor chip, a first substrate layer and a second substrate layer. The semiconductor chip has an active surface and a plurality of pads disposed on the active surface. The first substrate layer is formed on the active surface of the semiconductor chip and has a plurality of first contacts electrically connected to the pads of the semiconductor chip. The second substrate layer is substantially smaller than the first substrate layer, is formed on the first substrate layer, and has a plurality of second contacts electrically connected to the first contacts of the first substrate layer.

11 Claims, 7 Drawing Sheets

SEMICONDUCTOR PACKAGE AND METHOD FOR MANUFACTURING THE SAME

The present application is division of U.S. application Ser. No. 11/049,867, filed Feb. 4, 2005, which is based on, and claims priority from, Taiwan Application Number 093102846, filed Feb. 6, 2004, the disclosures of which are hereby incorporated by reference herein in their entirety. The present application is also related to the concurrently filed application titled "SEMICONDUCTOR PACKAGE AND METHOD FOR MANUFACTURING THE SAME".

BACKGROUND OF THE INVENTION

1. Field of the Invention

The present invention generally relates to a semiconductor package, and more particularly to a wafer level semiconductor package including substrate layer with higher packaging density of an integrated circuit.

2. Description of the Related Art

High efficiency, low cost, minimization and higher packaging density of a semiconductor package are objects that most electronic companies continuously attempt to achieve. The above-mentioned semiconductor packages are Multiple Chip Module/Stack/Ball Grid Array (MCM/Stack/BGA), Cavity Down Ball Grid Array (Cavity Down BGA), Flip Chip Ball Grid Array (Flip Chip BGA), Flip Chip Pin Grid Array (Flip Chip PGA) and Ball Grid Array which have active components and passive components.

However, the above-mention semiconductor packages generally include a substrate for supporting a semiconductor chip or for acting as an intermediate carrier between the semiconductor chip and a printed circuit board. Furthermore, the passive components are disposed in an extra space and on an extra area.

Referring FIG. 1, a conventional Chip Size Package (CSP) 2 includes a semiconductor chip 12 and a substrate layer 20 which is directly formed on an active surface 14 of the semiconductor chip 12. The substrate layer 20 includes two dielectric layers 15, 16 and a plurality of conductive traces 18. The dielectric layer 15 is disposed on the active surface 14 of the semiconductor chip 12. The conductive traces 18 are formed on the dielectric layer 15 and are electrically connected to a plurality of pads which are disposed on the active surface 14 of the semiconductor chip 12. The dielectric layer 16 is disposed on the dielectric layer 15 and the conductive traces 18, and parts of the conductive traces 18 are exposed out of the dielectric layer 16 so as to form a plurality of contacts. A plurality of solder balls 24 or conductive leads are disposed on the contacts for electrically connecting to an exterior device (not shown), e.g. a printed circuit board. A solder mask 26 is disposed on the dielectric layer 16 for surrounding the contacts 24. However, A much higher semiconductor package packaging density is still an object, in order to achieve minimization of the entire semiconductor package. In addition, the conventional Chip Size Package 2 cannot efficiently solve a problem that the passive components are disposed in an extra space and on an extra area. In other words, the semiconductor package must be provided with an extra space and on an extra area for receiving the passive components.

Accordingly, there exists a need for a semiconductor package capable of having a much higher integrated circuit packaging density.

SUMMARY OF THE INVENTION

It is an object of the present invention to provide a semiconductor package including substrate layers and having a much higher integrated circuit packaging density so as to achieve a minimization of the entire semiconductor package.

In order to achieve the foregoing objects, the present invention provides a semiconductor package including a semiconductor chip, a first substrate layer and a second substrate layer. The semiconductor chip has an active surface and a plurality of pads disposed on the active surface. The first substrate layer is formed on the active surface of the semiconductor chip and has a plurality of first contacts electrically connected to the pads of the semiconductor chip. The second substrate layer formed on the first substrate layer is substantially smaller than the first substrate layer, and has a plurality of second contacts electrically connected to the first contacts of the first substrate layer.

The semiconductor package of the present invention utilizes the Redistribution Layer (RDL) manufacturing process and the Build-up manufacturing process to form two substrate layers. The two substrate layers have different size and further define a cavity or a shoulder for receiving one or more second semiconductor chips and passive components. Furthermore, the semiconductor package according to the present invention can be directly installed on the printed circuit board without an intermediate carrier. Furthermore, the semiconductor package according to the present invention has a much higher packaging density of integrated circuit so as to achieve a minimization of the entire semiconductor package.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
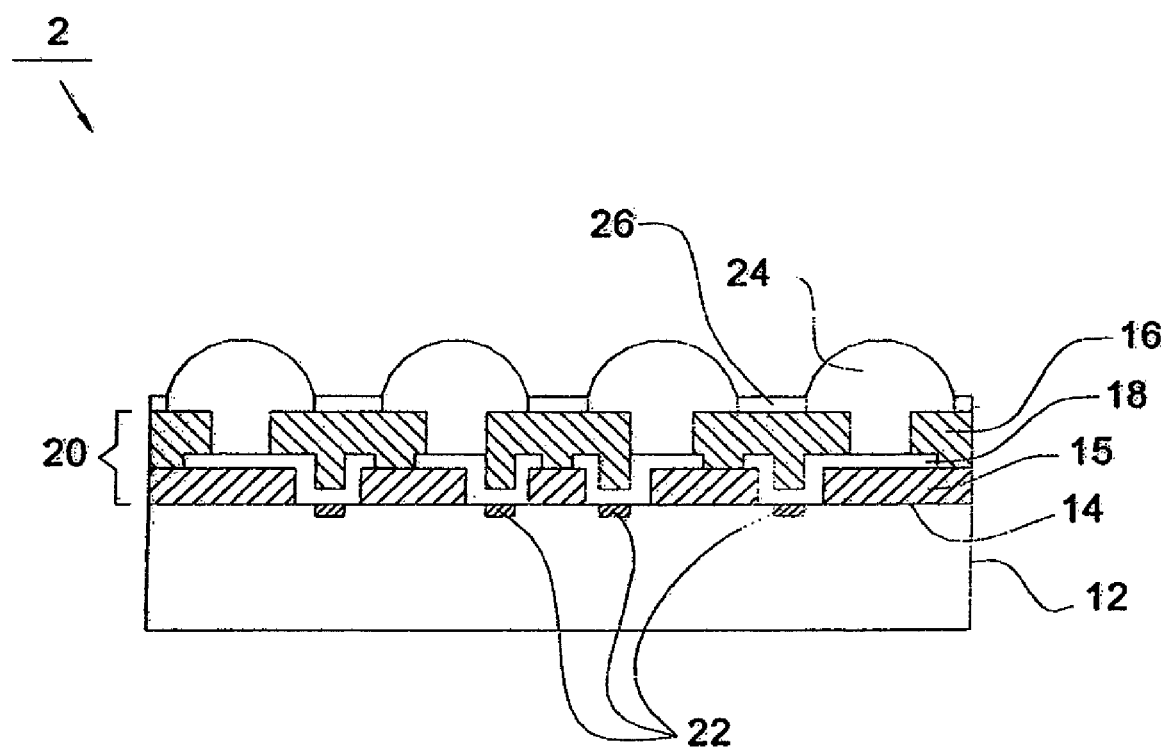
FIG. 1 is a sectional schematic view of a chip size package in the prior art.
Figure 2A:
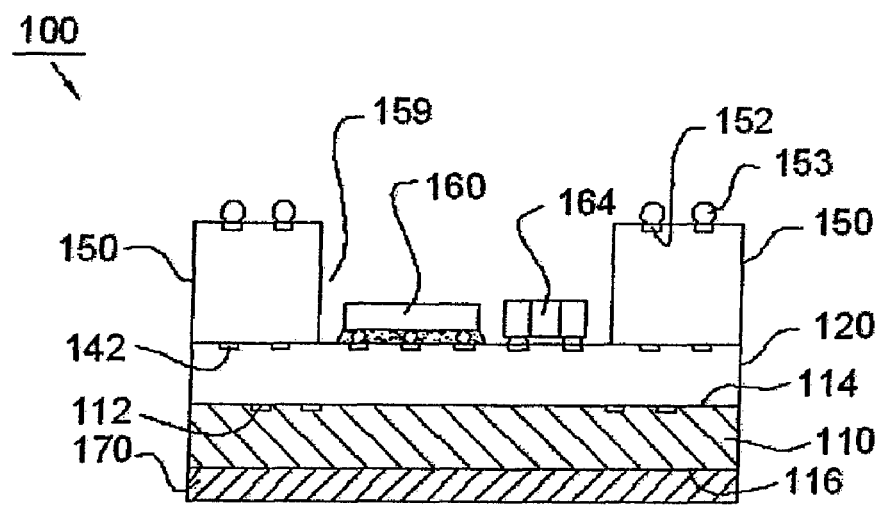
FIG. 2a is a sectional schematic view of a semiconductor package according to an embodiment of the present invention.
Figure 2B:
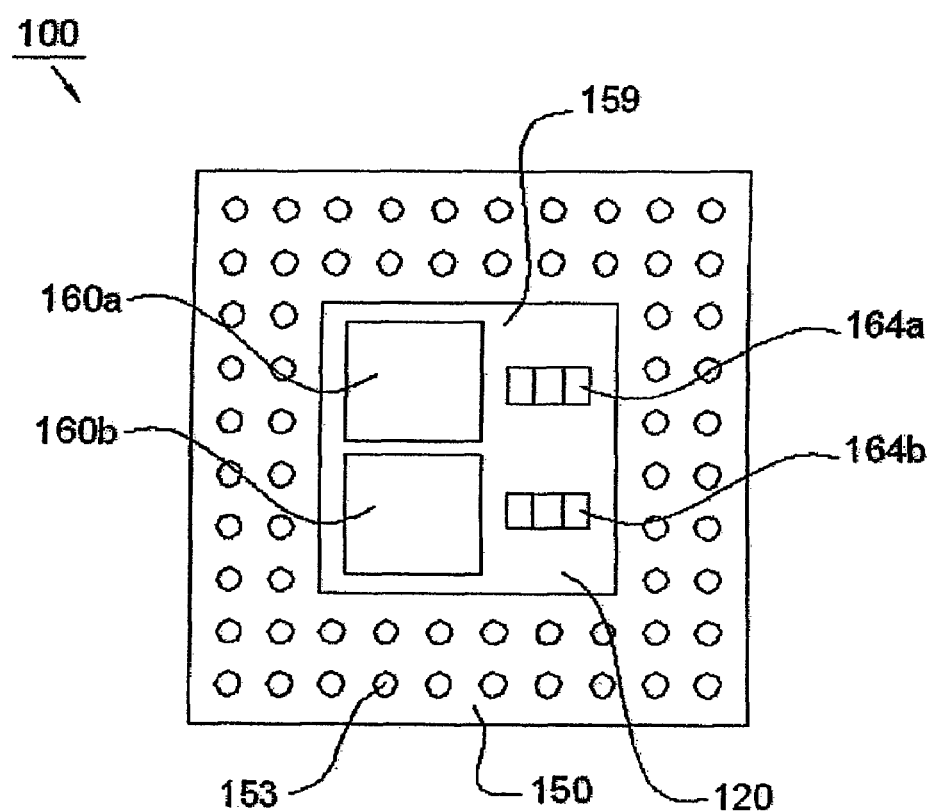
FIG. 2b is a plane schematic view of a semiconductor package according to an embodiment of the present invention.

Referring to FIGS. 2a and 2b, they depict a semiconductor package 100 according to an embodiment of the present invention. The semiconductor package 100 includes a first semiconductor chip 110 which has a plurality of pads 112 disposed on an active surface 114 of the first semiconductor chip 110. A substrate layer 120 is formed on the active surface 114 of the first semiconductor chip 110. An annular substrate layer 150 is formed on the substrate layer 120 for defining a cavity 159 on the substrate layer 120.

The substrate layer 120 and the annular substrate layer 150 respectively include at least one dielectric layer (described in the following article), a plurality of conductive traces (described in the following article) and a plurality of contacts 142, 152. The contacts 142 are electrically connected to the pads 112 through the conductive traces, and the contacts 152 are electrically connected to the contacts 142 through the conductive traces.

At least one second semiconductor chip 160, e.g. two second semiconductor chips 160a, 160b, are arranged parallel on the substrate layer 120, and at least one passive component 164, e.g. two passive components 164a, 164b, are disposed on the substrate layer 120, and the second semiconductor chip 160 and the passive component 164 are located in the cavity 159 surrounded by the annular substrate layer 150. The second semiconductor chip 160 can be electrically connected to the contacts 142 by means of a flip chip connection technology, and the passive component 164 is electrically connected to the contacts 142. A heat spreader 170 or a heat sink can be adhered to a back surface 116 of the first semiconductor chip 110. A plurality of exterior contacts, e.g. conductive leads or solder balls 153, are disposed on the contacts 152 of the annular substrate layer 150 for electrically connecting to an exterior device 180, e.g. a printed circuit board, such that the semiconductor package 100 can be installed on the exterior device 180, shown in FIG. 3.

The present invention provides a method for manufacturing the above-mentioned semiconductor package 100 by utilizing a Redistribution Layer (RDL) manufacturing process and a Build-up manufacturing process. Referring FIG. 4 to FIG. 9, these figures depict a method for manufacturing the above-mentioned semiconductor package 100 according to the present invention.

Figure 4:
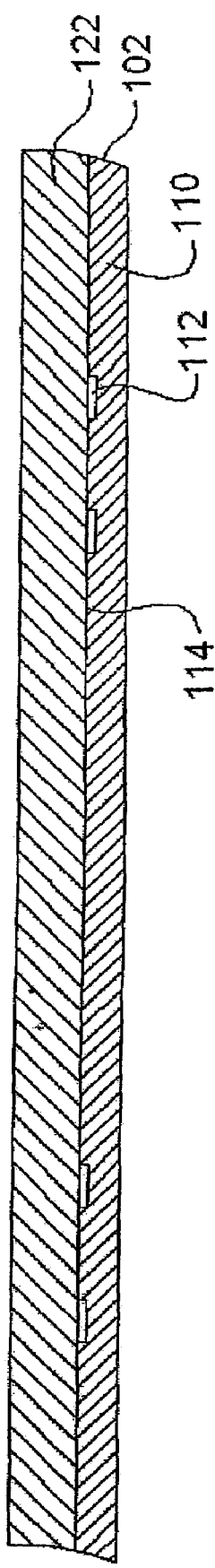
FIGS. 4 to 10 are sectional schematic views of a method for manufacturing a semiconductor package of the present invention.

Referring to FIG. 4, a semiconductor wafer 102 includes a plurality of first semiconductor chips 110, and each first semiconductor chip 110 has a plurality of pads 112 which are disposed on an active surface 114 of the semiconductor wafer 102. A dielectric layer 122 is formed on an active surface 114 of the semiconductor wafer 102.

Figure 5:
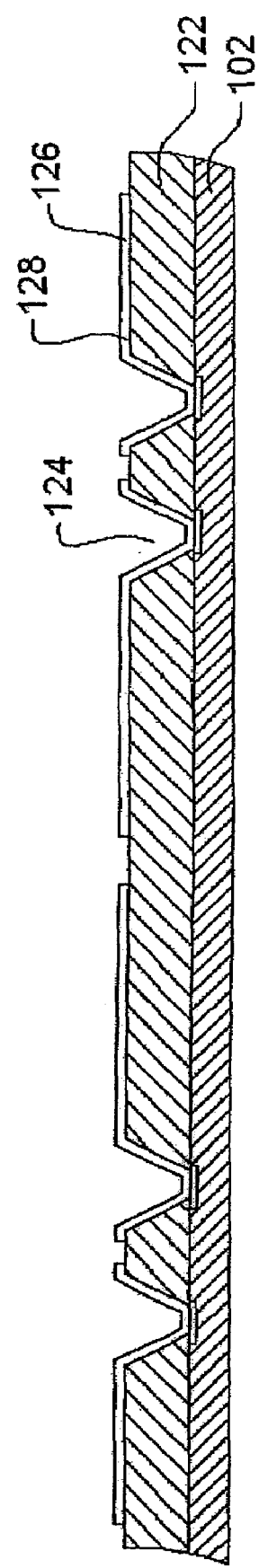

Referring to FIG. 5, a plurality of openings 124 are formed in the dielectric layer 122 by means of light reaction or laser manufacturing process, such that the pads 112 of the first semiconductor chip 110 are exposed out of the openings 124 of the dielectric layer 122. A conductive metal layer 126 is formed on the dielectric layer 122 and the pads 112 by means of electroplating or deposition processes. According to an embodiment of the present invention, a seeded metal layer is formed on the dielectric layer 122 and the pads 112 in advance, and then the thickness of the seeded metal layer is thickened to a predetermined thickness by means of electroplating processes, thereby forming the conductive metal layer 126. The openings 124 preferably have a profile of a wide upper portion and a narrow lower portion for facilitating to electroplate the conductive metal layer 126 on the interior of the openings 124 and the pads 112. According to an embodiment of the present invention, the conductive metal layer 126 can be fully electroplated or filled in the openings 124 and on the dielectric layer 122. Then, a plurality of conductive traces 128 are formed on the dielectric layer 122 and the pads 112 by selectively etching the conductive metal layer 126.

Figure 6:
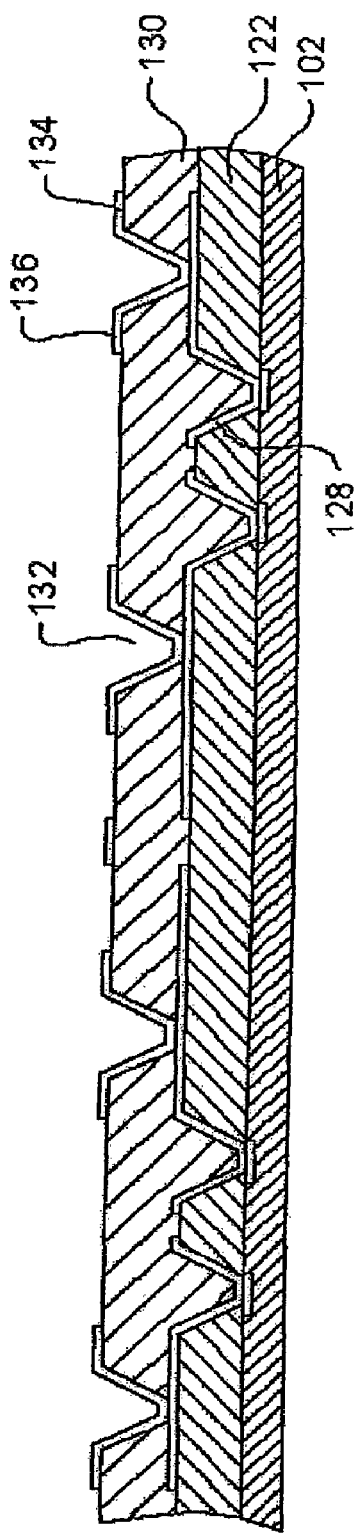

Referring to FIG. 6, another dielectric layer 130 is formed on the dielectric layer 122 and the conductive traces 128. A plurality of openings 132 are formed in the dielectric layer 130 by means of light reaction or laser manufacturing process, such that parts of the conductive traces 128 are exposed out of the openings 132 of the dielectric layer 130. A conductive metal layer 134 is formed on the dielectric layer 130 and the parts of the conductive traces 128 by means of electroplating or deposition mode. Then, a plurality of conductive traces 136 are formed on the dielectric layer 130 and the parts of the conductive traces 128 by selectively etching the conductive metal layer 134.

Figure 7:
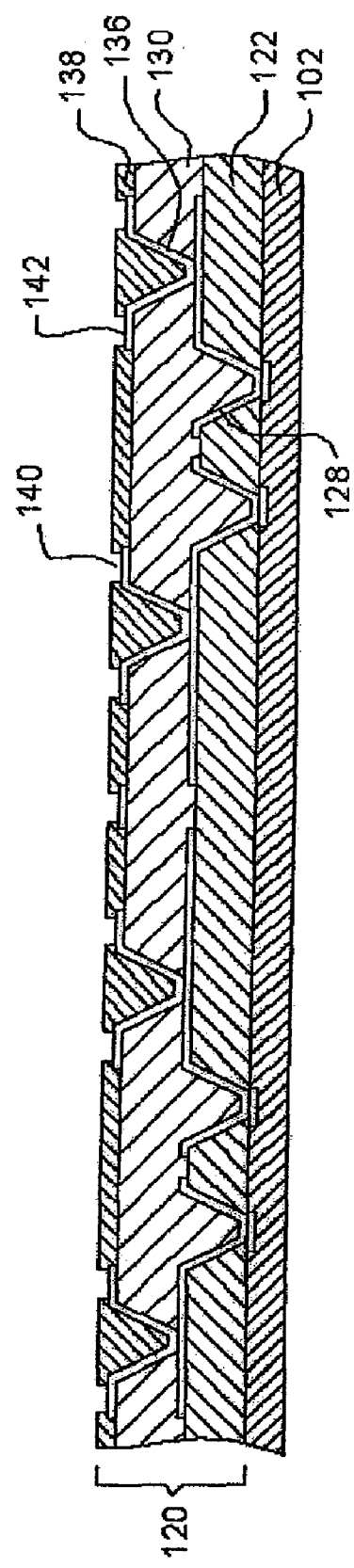

Referring to FIG. 7, a dielectric layer 138 is formed on the dielectric layer 130 and the conductive traces 136. A plurality of openings 140 are formed in the dielectric layer 138 by means of light reaction or laser manufacturing process, such that the parts of the conductive traces 136 are exposed out of the openings 140 of the dielectric layer 138, thereby forming a plurality of contacts 142.

Figure 8:
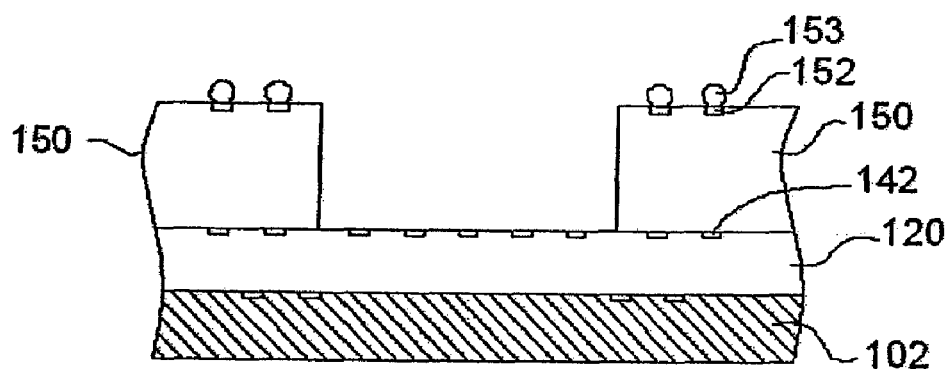

Referring to FIG. 8, an annular substrate layer 150, e.g. rectangle or circular shape, is formed on the substrate layer 120 for defining a cavity 159 on the substrate layer 120. The manufacturing process of the annular substrate layer 150 is similar to that of the substrate layer 120. A plurality of contacts 152 are formed on the annular substrate layer 150 and are electrically connected to the contacts 142 of the substrate layer 120.

It is apparent to one of ordinary skill in the art that the above-mentioned that the substrate layer 120 and the annular substrate layer 150 are manufactured by means of a build-up manufacturing process. However, the manufacturing method of the substrate layer 120 and the annular substrate layer 150 is not limited to the build-up manufacturing process, i.e. the manufacturing method can be a lamination manufacturing process as well.

Figure 9:
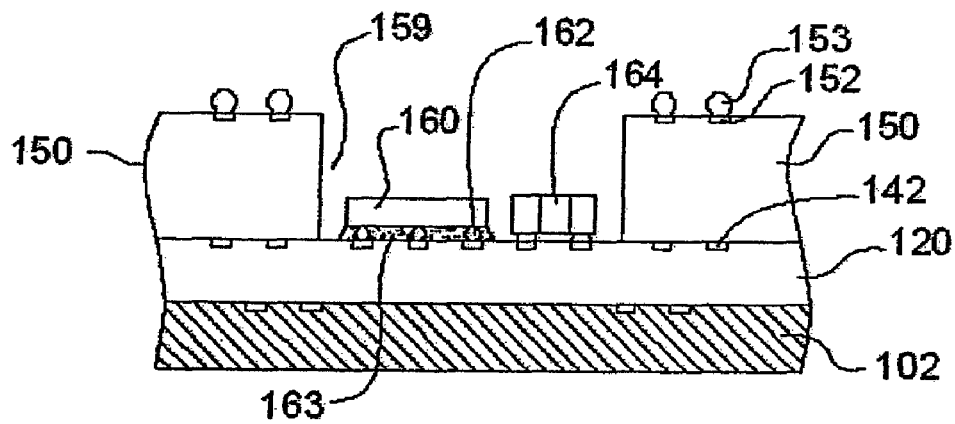

Referring to FIG. 9, the annular substrate layer 150 defines the cavity 159 located on the substrate layer 120. A second semiconductor chip 160 and a passive component 164 are disposed on the substrate layer 120 and in the cavity 159 surrounded by the annular substrate layer 150. The second semiconductor chip 160 can be electrically connected to the contacts 142 of the substrate layer 120 through a plurality of bumps 162 and by means of a flip chip connection technology, and an underfill 163 (such as epoxy) is disposed between the second semiconductor chip 160 and the substrate layer 120. It is apparent to one of ordinary skill in the art that the second semiconductor chip 160 can be electrically connected to the substrate layer 120 by means of a wire bonding connection technology and a molding compound is fully filled in the cavity 159 of the annular substrate layer 150 for encapsulating the second semiconductor chip 160.

In addition, in an alternative embodiment, the semiconductor package 100 further includes a plurality of second semiconductor chips 160 are stacked or parallel disposed on the substrate layer 120. It is apparent to one of ordinary skill in the art that the second semiconductor chips 160 can be electrically connected to the substrate layer 120 by means of a flip chip connection technology or a wire bonding connection technology. A plurality of solder balls 153 are formed on the contacts 152 of the annular substrate layer 150 for electrically connecting to an exterior device (not shown), e.g. a printed circuit board.

Figure 3:
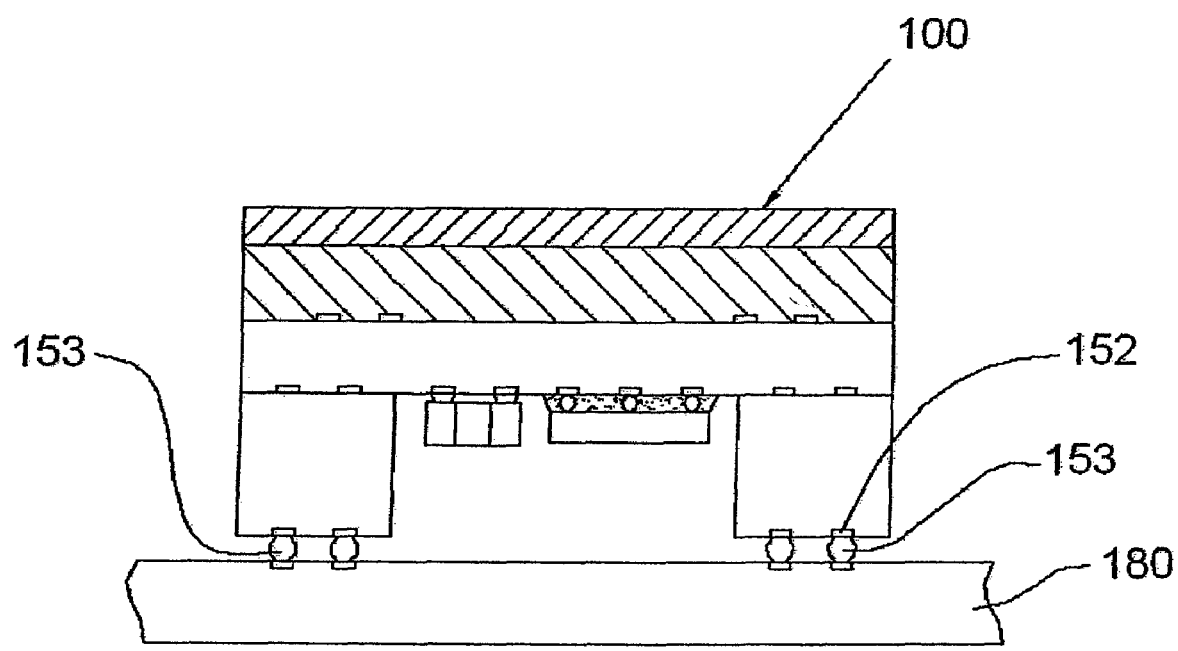
FIG. 3 is a sectional schematic view of a semiconductor package according to an embodiment of the present invention and an exterior device.

It is apparent to one of ordinary skill in the art that the thickness of the annular substrate layer 150 is larger than the height of the second semiconductor chip 160 and the passive component 164 so as to avoid the interference between the second semiconductor chip 160 and the printed circuit board (or the passive component 164 and the printed circuit board) when the semiconductor 100 is installed on the printed circuit board, shown in FIG. 3.

Figure 10:
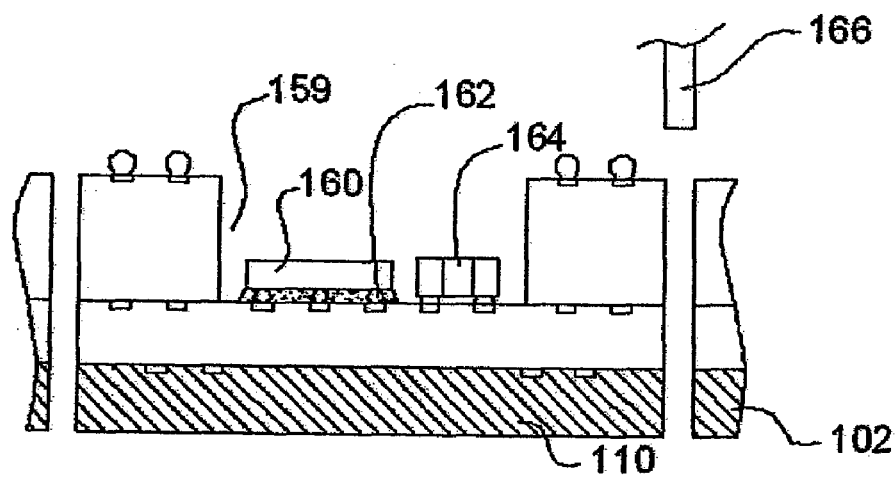

Referring to FIG. 10, the semiconductor wafer 102 is cut by means of a cutting device 166 for separating each first semiconductor chip 110 from one another, thereby forming the plurality of semiconductor packages 100.

As shown in FIG. 2a, a heat spreader 170 can be adhered to a back surface 116 of the first semiconductor chip 110 for dissipating heat before the semiconductor wafer 102 is cut.

The method for manufacturing the semiconductor package according to the present invention utilizes a wafer level manufacturing process to dispose the second semiconductor chip and the passive component, and therefore it substantially decreases the manufacturing time of the semiconductor package.

Figure 11:
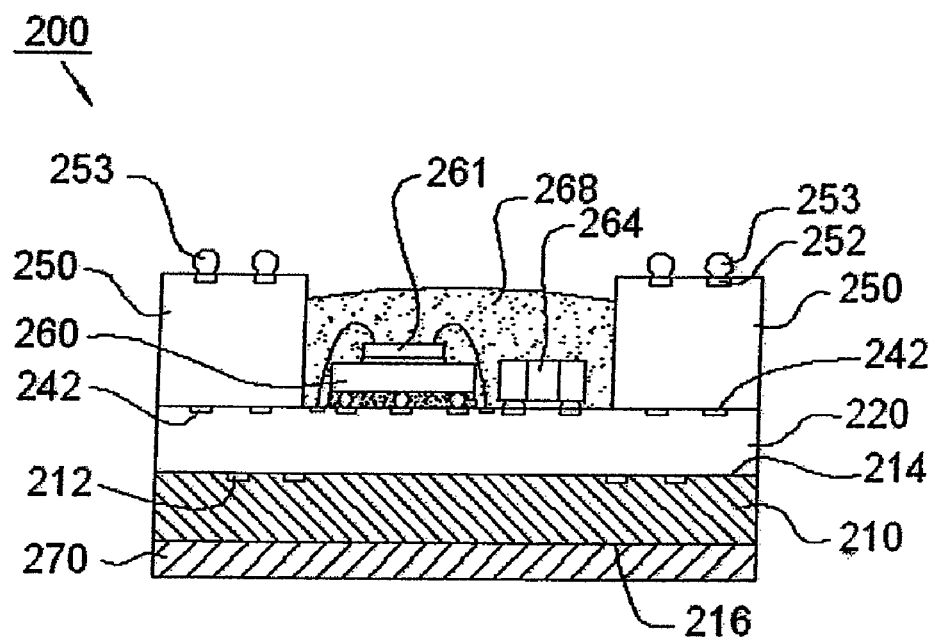
FIG. 11 is a sectional schematic view of a semiconductor package according to another embodiment of the present invention.

Referring to FIG. 11, it depicts a semiconductor package 200 according to another embodiment of the present invention. The semiconductor package 200 is substantially similar to the semiconductor package 100, wherein the similar elements are designated with the similar reference numerals. The semiconductor package 200 includes a first semiconductor chip 210 which has a plurality of pads 212 disposed on an active surface 214 of the first semiconductor chip 210. A substrate layer 220 is formed on the active surface 214 of the first semiconductor chip 210. An annular substrate layer 250 is formed on the substrate layer 220. The substrate layer 220 and the annular substrate layer 250 respectively include at least one dielectric layer (not shown), a plurality of conductive traces (not shown) and a plurality of contacts 242, 252. The contacts 242 are connected to the pads 212 through the conductive traces, and the contacts 252 are electrically connected to the contacts 242 through the conductive traces. Two second semiconductor chips 260, 261 and a passive component 264 are disposed on the substrate layer 220, and are located in a cavity surrounded by the annular substrate layer 250. The second semiconductor chip 260 can be electrically connected to the contacts 242 by means of a flip chip connection technology. The second semiconductor chip 261 is adhered to the second semiconductor chip 260, and the second semiconductor chip 261 can be electrically connected to the contacts 242 by means of a wire bonding connection technology. The passive component 264 is electrically connected to the contacts 242. The cavity surrounded by the annular substrate layer 250 is filled with a molding compound 268 for encapsulating the second semiconductor chip 260, 261 and the passive component 264. A heat spreader 270 or a heat sink can be adhered to a back surface 216 of the first semiconductor chip 210. A plurality of exterior contacts, e.g. conductive leads or solder balls 253, are disposed on the contacts 252 of the annular substrate layer 250 for electrically connecting to an exterior device (not shown).

Figure 12:
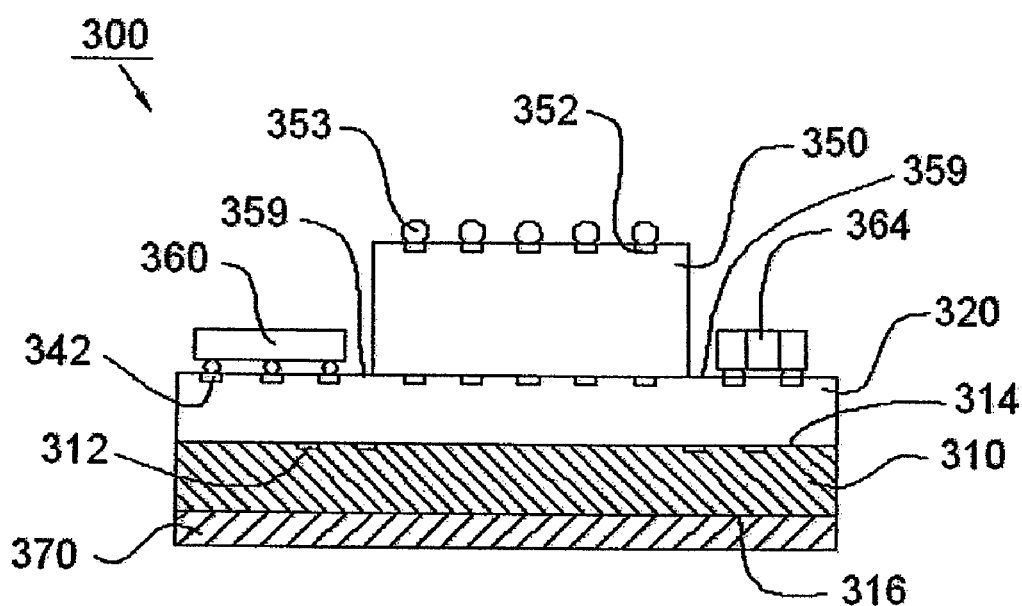
FIG. 12 is a sectional schematic view of a semiconductor package according to a further embodiment of the present invention.

Referring to FIG. 12, it depicts a semiconductor package 300 according to a further embodiment of the present invention. The semiconductor package 300 is substantially similar to the semiconductor package 100, wherein the similar elements are designated with the similar reference numerals. The semiconductor package 300 includes a first semiconductor chip 310 which has a plurality of pads 312 disposed on an active surface 314 of the first semiconductor chip 310. A substrate layer 320 is formed on the active surface 314 of the first semiconductor chip 310. A substrate layer 350, e.g. a rectangle shape, is formed on the substrate layer 320, and the size of the substrate layer 350 is substantially bigger than the size of the substrate layer 320 for forming a shoulder 359 on the substrate layer 320. The shoulder 359 can be an annular area. The substrate layers 320, 250 respectively include at least one dielectric layer (not shown), a plurality of conductive traces (not shown) and a plurality of contacts 342, 352. The contacts 342 are connected to the pads 312 through the conductive traces, and the contacts 352 are electrically connected to the contacts 342 through the conductive traces. A second semiconductor chip 360 and a passive component 364 are disposed on the shoulder 359. The second semiconductor chip 360 can be electrically connected to the contacts 342 by means of a flip chip connection technology, and the passive component 364 is electrically connected to the contacts 342. A heat spreader 370 or a heat sink can be adhered to a back surface 316 of the first semiconductor chip 310. A plurality of exterior contacts, e.g. conductive leads or solder balls 353, are disposed on the contacts 352 of the substrate layer 350 for electrically connecting to an exterior device (not shown).

A method for manufacturing the semiconductor package of the present invention utilizes the Redistribution Layer (RDL) manufacturing process and the Build-up manufacturing process to form two substrate layers. The two substrate layers have different size and further define a cavity or a shoulder for receiving one or more second semiconductor chips and passive components. Furthermore, the semiconductor package according to the present invention can be directly installed on the printed circuit board without an intermediate carrier. Furthermore, the semiconductor package according to the present invention has a much higher integrated circuit packaging density so as to achieve an object of the minimization of the entire semiconductor package. It is apparent to one of ordinary skill in the art that the semiconductor package according to the present invention can be applied in the filed of Plastic Ball Grid Array (PBGA), Heat Slug Ball Grid Array (HSBGA), Cavity Down Ball Grid Array, Chip Size Package Ball Grid Array (CSP BGA), Thin Fine Pitch Ball Grid Array (TFBGA), Low Fine Pitch Ball Grid Array (LFBGA) and Very Fine Pitch Ball Grid Array (VFBGA).

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
    a first semiconductor chip having an active surface, a back surface and a plurality of pads disposed on the active surface:
    a first substrate layer formed on the active surface of the first semiconductor chip and comprising a plurality of first contacts electrically connected to the pads wherein the first substrate layer has a first surface and a second surface opposite to the first surface, and the second surface disposed on the active surface of the first semiconductor chip;
    a second substrate layer formed on the first surface of the first substrate layer and comprising a plurality of second contacts electrically connected to the first contacts, wherein the second substrate layer is annular shape for defining a cavity on the first surface of the first substrate layer; and
    a component disposed on the first surface of the first substrate layer and located in the cavity.

2. The semiconductor package as claimed in claim 1, wherein the first substrate layer further comprises at least one first dielectric layer and a plurality of first conductive traces disposed on the first dielectric layer for electrically connecting the first contacts to the pads.

3. The semiconductor package as claimed in claim 1, wherein the second substrate layer further comprises at least one second dielectric layer and a plurality of second conductive traces disposed on the second dielectric layer for electrically connecting the second contacts to the first contacts.

4. The semiconductor package as claimed in claim 1, wherein the component is a second semiconductor chip.

5. The semiconductor package as claimed in claim 1, further comprising:
   a plurality of second semiconductor chips stacked on the first substrate layer and located in the cavity.

6. The semiconductor package as claimed in claim 1, further comprising:
   a plurality of second semiconductor chips parallel disposed on the first substrate layer and located in the cavity.

7. The semiconductor package as claimed in claim 4, wherein the second semiconductor chip is electrically connected to the first contacts by means of a flip chip connection technology.

8. The semiconductor package as claimed in claim 7, further comprising:
   an underfill disposed between the second semiconductor chip and the first substrate layer.

9. The semiconductor package as claimed in claim 4, wherein the second semiconductor chip is electrically connected to the first contacts by means of a wire bonding connection technology.

10. The semiconductor package as claimed in claim 9, further comprising:
    a molding compound filling in the cavity.

11. The semiconductor package as claimed in claim 1, further comprising:
    at least one passive component disposed on the first substrate layer and located in the cavity.

* * * * *